United States Patent
Koyama et al.

(10) Patent No.: US 10,756,481 B2
(45) Date of Patent: Aug. 25, 2020

(54) CONNECTOR AND CONNECTOR ASSEMBLY

(71) Applicant: SMK Corporation, Tokyo (JP)

(72) Inventors: Yuki Koyama, Tokyo (JP); Kiyoshi Asai, Kanagawa (JP); Toshihiko Kato, Kanagawa (JP)

(73) Assignee: SMK Corporation, Tokyo (JP)

( * ) Notice: Subject to any disclaimer, the term of this patent is extended or adjusted under 35 U.S.C. 154(b) by 0 days.

(21) Appl. No.: 16/544,872

(22) Filed: Aug. 19, 2019

(65) Prior Publication Data

US 2020/0067231 A1 Feb. 27, 2020

(30) Foreign Application Priority Data

Aug. 21, 2018 (JP) .................................. 2018-154399

(51) Int. Cl.
| | |
|---|---|
| *H01R 13/62* | (2006.01) |
| *H01R 13/50* | (2006.01) |
| *H01R 12/70* | (2011.01) |
| *H05K 1/18* | (2006.01) |
| *H05K 1/11* | (2006.01) |
| *H01R 13/24* | (2006.01) |
| *H01R 12/71* | (2011.01) |

(52) U.S. Cl.
CPC ..... *H01R 13/6205* (2013.01); *H01R 12/7011* (2013.01); *H01R 13/50* (2013.01); *H05K 1/118* (2013.01); *H05K 1/189* (2013.01); *H01R 12/716* (2013.01); *H01R 13/2471* (2013.01); *H05K 2201/10189* (2013.01)

(58) Field of Classification Search
CPC .......................... H01R 13/6205; H01R 13/50; H01R 12/7011; H05K 1/118; H05K 1/189
See application file for complete search history.

(56) References Cited

U.S. PATENT DOCUMENTS

| | | | | |
|---|---|---|---|---|
| 8,187,006 | B2 * | 5/2012 | Rudisill | H01R 11/30 |
| | | | | 362/249.06 |
| 9,300,081 | B2 * | 3/2016 | Rudisill | H01R 11/30 |
| 9,510,649 | B1 * | 12/2016 | Liu | A44B 17/0005 |
| 10,367,291 | B2 * | 7/2019 | Asai | H01R 13/6205 |

FOREIGN PATENT DOCUMENTS

| | | |
|---|---|---|
| JP | 2009134892 A | 6/2009 |
| JP | 2016048614 A | 4/2016 |

OTHER PUBLICATIONS

Office Action issued for counterpart Japanese Application No. 2018-154399, issued by the Japan Patent Office dated Feb. 12, 2019 (drafted on Feb. 6, 2019).

* cited by examiner

*Primary Examiner* — Xuong M Chung Trans

(57) ABSTRACT

A connector and a connector assembly capable of being attached to a freely bendable object such as clothes when used are provided. The connector to be fit to a counterpart connector includes a housing; a conductive contact provided in the housing; and a plurality of holding members comprising a magnetic material provided in the housing. The holding member is configured to be attracted to a magnetic material of the counterpart connector when the connector is fit to the counterpart connector to maintain a fit state. The housing is bendable, and has a plurality of fixing holes formed therein. The holding members are disposed in parallel apart from each other in a longitudinal direction (X direction) in the surface of the housing.

8 Claims, 14 Drawing Sheets

CONNECTOR AND CONNECTOR ASSEMBLY

CROSS REFERENCE TO RELATED APPLICATION

The contents of the following Japanese patent application are incorporated herein by reference, Japanese Patent Application No. 2018-154399 filed on Aug. 21, 2018.

FIELD

The present invention relates to a connector and a connector assembly.

BACKGROUND

A configuration in which a connector (receptacle) and a counterpart connector (plug) are fit to each other while being attracted to each other by the action of a magnetic force has already been known. Specifically, the connector includes a magnetic metal member, and the counterpart connector includes a magnet. The magnetic metal member and the magnet are attracted to each other, thereby retaining the fit state (for example, see Patent Literature 1).

Patent Literature 1 discloses a connector that retains a fit state with a counterpart connector by means of a magnetic force. The connector includes a plurality of contacts and a magnetic metal member in a housing. The counterpart connector includes a plurality of contacts and a magnet in a shell that is accommodated in a housing. When the connector is fit to the counterpart connector, the contacts are in contact with each other, and the magnet of the counterpart connector and the magnetic metal member of the connector are attracted to each other by the magnetic force to maintain the fit state.

CITATION LIST

Patent Literature

Patent Literature 1: Japanese Patent Application Laid-Open No. 2016-048614

SUMMARY

Technical Problem

However, in the conventional connector described in Patent Literature 1, in addition that the housing itself has a high rigidity, the magnetic metal member having a high rigidity is disposed on the entire fitting surface of the connector. Therefore, it is difficult to attach the connector to a freely bendable object such as clothes. If the connector were attached to such an object, the connector could not follow the bending of the object, possibly resulting in dropping off of the connector from the object, breakage of the object by the connector, or giving a sense of discomfort to a wearer, for example.

The present invention has been made to solve the aforementioned problem, and an object of the present invention is to provide a connector and a connector assembly that can be used while being attached to a freely bendable object such as clothes.

Solution to Problem

To achieve the above-described object, a connector according to an aspect of the present invention is to be fit to a counterpart connector. The connector includes: a plate-shaped housing; a conductive contact provided in the housing; and a plurality of holding members comprising a magnetic material provided in the housing, the holding members being configured to be attracted to a magnetic material of the counterpart connector when the connector is fit to the counterpart connector, to maintain a fit state. The housing comprises a bendable insulating material, and has a plurality of fixing holes that are formed therein and into which a fixing material is inserted, thereby fixing the housing to a freely bendable object. The contact is formed through the housing from one surface of the housing to the other surface thereof. The holding members are disposed in parallel apart from each other in a predetermined direction in the one surface of the housing. The housing is bent so as to bring both end portions of the housing in the predetermined direction close to each other.

As described above, the housing of the connector according to the aspect of the present invention comprises the bendable plate-shaped insulating material, and the plurality of holding members comprising the magnetic material are disposed in parallel apart from each other in the predetermined direction in the one surface of the housing. This configuration enables the housing of the connector to flexibly bend so as to bring at least both the end portions of the housing in the predetermined direction close to each other. In other words, the holding members do not interfere with the bending of the housing. The fixing holes provided in the housing of the connector according to the aspect of the present invention facilitates fixing the connector on the object.

In the connector according to an aspect of the present invention, the housing may include a plurality of the contacts, and the fixing holes may be formed and arranged in parallel rows along the predetermined direction in the one surface of the housing in positions where the contacts are interposed therebetween and in such a manner as to penetrate from the one surface to the other surface.

According to this configuration, the connector can be fixed on the object. When the object is bent, the housing having the contacts can be bent while following the object, so that the connector can be bent while being caused to follow the object.

In the connector according to an aspect of the present invention, the fixing holes may be formed in positions where each of the contacts is interposed therebetween.

According to this configuration, each of the contacts can be independently fixed on the object. When the object is bent, the housing having the contacts can be bent while following the object in each fixed portion, so that the contacts and the object can be reliably made conductive even in a bent state.

In the connector according to an aspect of the present invention, the housing may be configured to have an accommodation recessed portion formed between the fixing hole and the contact in the one surface.

According to this configuration, when the connector is fixed on the object by inserting the fixing material into the fixing holes, the fixing material on the front surface of the housing can be accommodated in the accommodation recessed portion, so that it is possible to prevent a protrusion of the fixing material from the front surface of the housing. Therefore, when the connector is fit to the counterpart connector, the posture in the fit state becomes stable without interference with the fixing material between the connector and the counterpart connector, thus enabling stable electric connection.

In the connector according to an aspect of the present invention, the contact may have a contact projection portion projecting to the side of the other surface.

According to this configuration, when the contacts are electrically connected to a conductive pattern wired in the object, the electrical connection can be directly made. Therefore, it is possible to eliminate the need for a conductive member, such as a solder material or a conductive adhesive, to connect between the contacts and the conductive pattern, thus allowing a reduction in the number of assembly processes and a cost reduction due to a reduction in the number of parts.

In the connector according to an aspect of the present invention, the contact may have a contact portion on the other surface of the housing, the contact portion may be configured such that the connector is electrically connected to the conductive pattern of the object, and the fixing material may be inserted into the fixing holes to fix the connector on the object.

According to this configuration, the connector can be easily fixed on the object without using an adhesive or the like, with the use of the fixing material that is suited for the size and distance of the fixing holes.

In the connector according to an aspect of the present invention, the fixing hole disposed between adjacent ones of the contacts may be configured such that at least two of the fixing materials having been inserted into other fixing holes may be inserted thereinto.

According to this configuration, since the fixing hole into which the fixing materials are inserted are shared between the plurality of fixing materials, it is possible to prevent an increase in the number of the fixing holes provided in the housing and therefore to downsize the connector.

In the connector according to an aspect of the present invention, the fixing material may be a sewing thread.

According to this configuration, even if there are a plurality of types of housings having fixing holes of various distances and sizes, it is unnecessary to prepare a fixing material specific to each housing. By inserting the sewing threads into the fixing holes and sewing the connector on the object, the connectors having the various fixing holes can be fixed on the objects.

A connector assembly according to an aspect of the present invention includes any of the connectors described above, and a counterpart connector to be fit to the connector. The counterpart connector includes a counterpart housing, a conductive counterpart contact provided in the counterpart housing, and a counterpart holding member having a magnetic material provided in the counterpart housing. When the connector is fit to the counterpart connector, the contact is in contact with the counterpart contact, and the holding member and the counterpart holding member are attracted to each other by a magnetic force to maintain a fit state.

According to the aspect(s) of the present invention, it is possible to provide the connector and the connector assembly that can be used while being easily attached to a freely bendable object such as clothes.

DESCRIPTION OF EMBODIMENTS

Figure 1A:
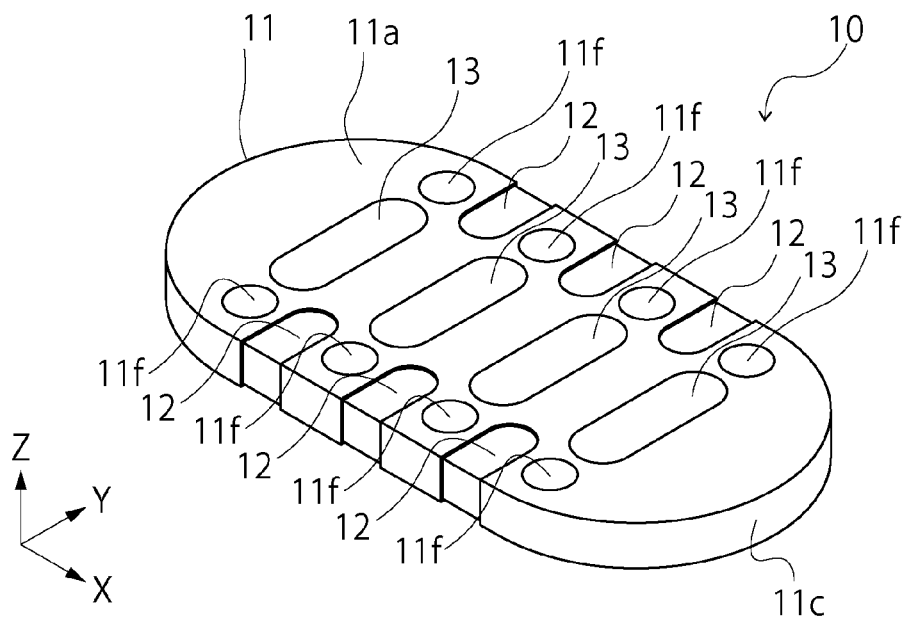
FIG. 1A is a perspective view of a connector according to a first embodiment of the present invention.

Connectors according to embodiments of the present invention will be described below with reference to the drawings.

First Embodiment

As shown in FIGS. 1A to 2C, a connector 10 according to a first embodiment of the present invention includes a plate-shaped housing 11, conductive contacts 12 provided in the housing 11, and holding members 13 formed of a magnetic material that are provided in the housing 11. As described later in detail, when the connector 10 is fit to a counterpart connector 20, the holding members 13 maintain a fit state by a magnetic force.

Figure 3A:
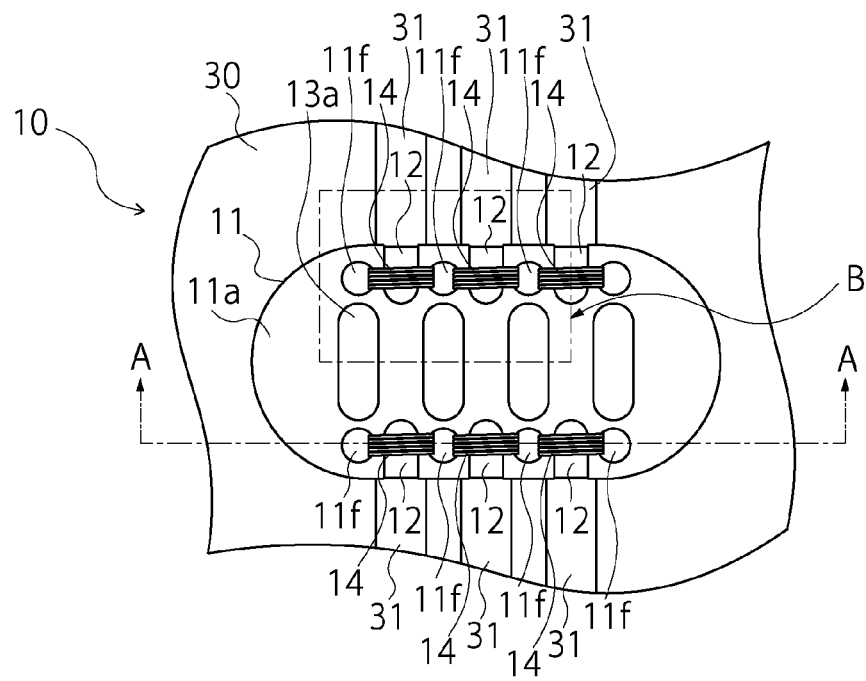
FIG. 3A is an explanatory view of the connector of FIGS. 1A and 1B in a state of being sewed on clothes.
Figure 3B:
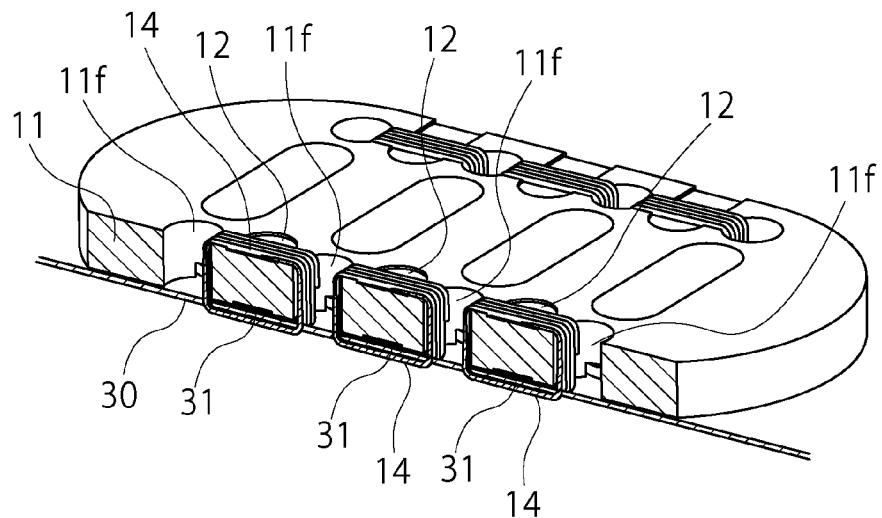
FIG. 3B is a perspective view of the connector of FIGS. 1A and 1B taken along line A-A of FIG. 3A.

In FIGS. 3A and 3B, the connector 10 is sewed on clothes 30 (object) by inserting insulating sewing threads 14 (fixing materials) into fixing holes 11f provided in the housing 11. In the clothes 30, a conductive pattern 31 is formed by a conductive ink. The conductive pattern 31 of the clothes 30 is electrically connected to the contacts 12 (contact portions 12b) of the connector 10 sewed on the clothes 30 with not-illustrated conductive members interposed therebetween. As an example of the conductive member, there may be mentioned a solder material, a conductive adhesive, an anisotropic conductive film, and the like, but the conductive member is not limited thereto. By fitting of the connector 10 sewed on the clothes 30 with the counterpart connector 20, the conductive pattern 31 of the clothes 30 connected to the connector 10 is electrically connected to wiring (electric wire 28) connected to the counterpart connector 20.

As described above, since the present embodiment uses the fixing holes 11f of the housing 11 to sew the connector 10 on the clothes 30, the connector 10 can be easily fixed on the clothes 30, without the need for sewing the sewing threads 14 while opening holes by a needle or the like in the housing 11. There is no concern about a crack in the housing due to sewing of the sewing threads while opening holes by a needle in the housing.

In the present embodiment, the connector 10 is a receptacle and the counterpart connector 20 is a plug, but the present invention is not limited thereto. The connector 10 may be a plug, and the counterpart connector 20 may be a receptacle. Each component of the connector 10 will be described below.

<Housing>

Figure 5A:
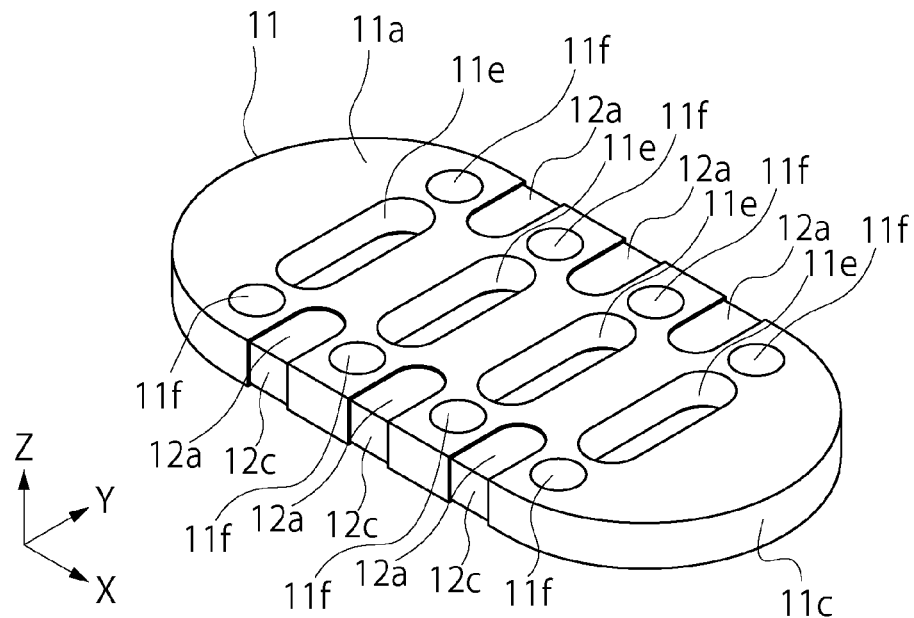
FIG. 5A is a perspective view in which holding members has been removed from the connector of FIGS. 1A and 1B.
Figure 5B:
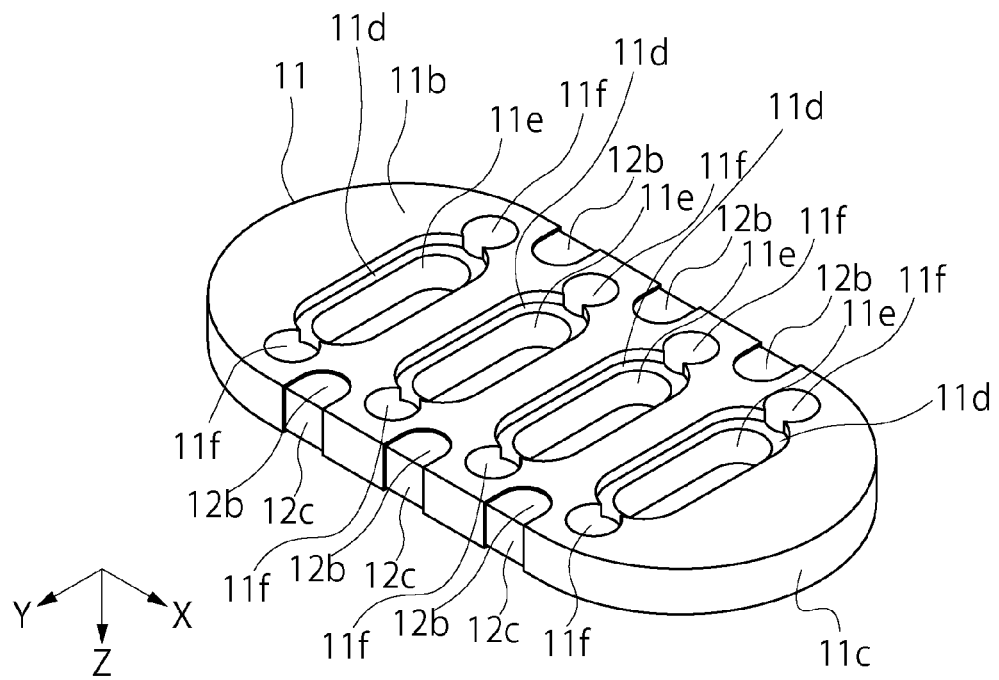
FIG. 5B is a perspective view of the connector, viewed from its bottom side, in which holding members has been removed from the connector of FIGS. 1A and 1B.

As shown in FIGS. 5A and 5B, the housing 11 is formed of a bendable plate-shaped insulating material (for example, rubber, elastomer, or the like). Both ends of the housing 11 in a longitudinal direction (X direction) of the plate are in an arc shape. This prevents damage by the housing 11 to the clothes 30 when the connector 10 is attached to the clothes 30. In the housing 11, four through holes 11e are formed in the middle of a plate width direction (Y direction) at regular intervals along the longitudinal direction (X direction). On a bottom surface 11b of the housing 11, recessed portions 11d larger than the through holes 11e are formed.

Although details will be described later, in the housing 11, the contacts 12 are arranged in the longitudinal direction (X direction) of the housing 11 in rows. The cylindrical fixing holes 11f penetrating the housing 11 in a thickness direction (Z direction) are formed between the contacts 12 and on both sides with respect to the arrangement direction (X direction) of the contacts 12 and arranged in parallel rows along a predetermined direction in a front surface 11a (one surface) of the housing 11.

The housing 11 according to the present embodiment is a plate member the both ends of which are in an arc shape, but the present invention is not limited thereto. The housing 11 may have an arbitrary shape such as a circular, an oval shape, or a rectangle. However, in order to prevent damage to the clothes 30, the housing 11 preferably has a shape having no corner. The housing 11 is not necessarily in a plate shape, but the thickness of a portion to be sewed on the object is preferably thin enough to be sewed easily.

<Holding Member>

The holding member 13 is formed of a magnetic metal (for example, a magnetic stainless steel). When the connector 10 is fit to the counterpart connector 20, the holding members 13 are attracted to a magnet 24 of the counterpart connector 20 to maintain a fit state. The holding member 13 has higher rigidity than that of the housing 11, and has the function of maintaining the form of the connector 10.

Figure 6A:
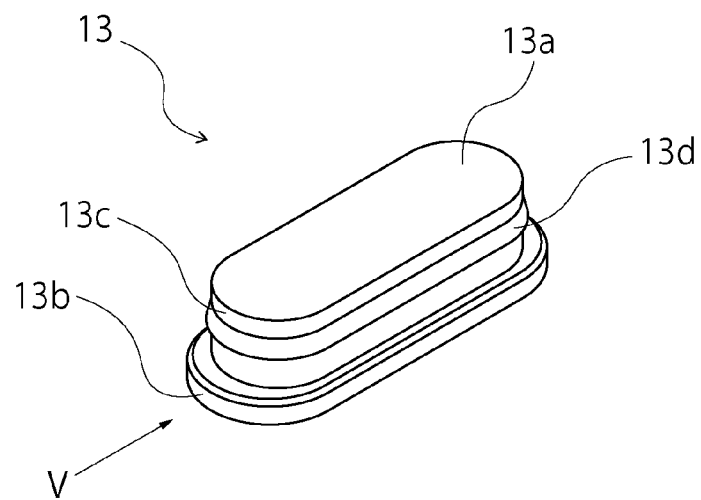
FIG. 6A is a perspective view of the holding member of FIGS. 1A and 1B.
Figure 6B:
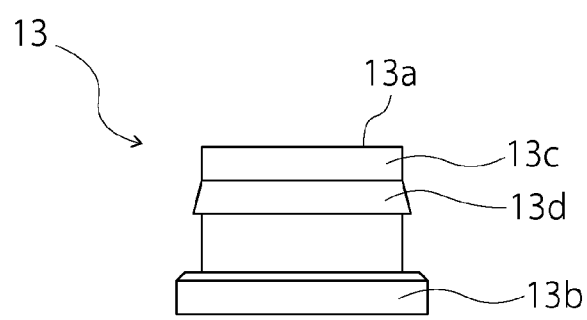
FIG. 6B is a side view of FIG. 6A viewed in the direction of an arrow V.
Figure 7A:
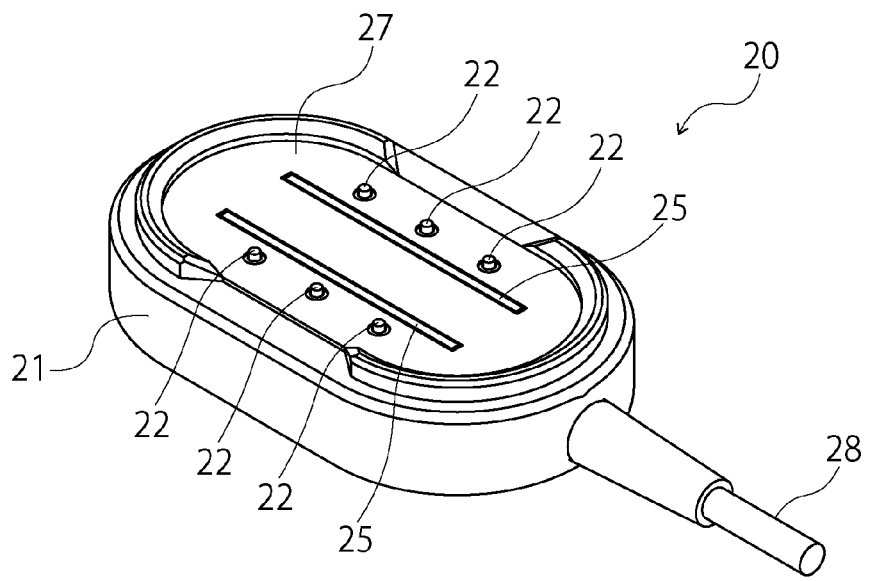
FIG. 7A is a perspective view of a counterpart connector according to the first embodiment of the present invention.
Figure 7B:
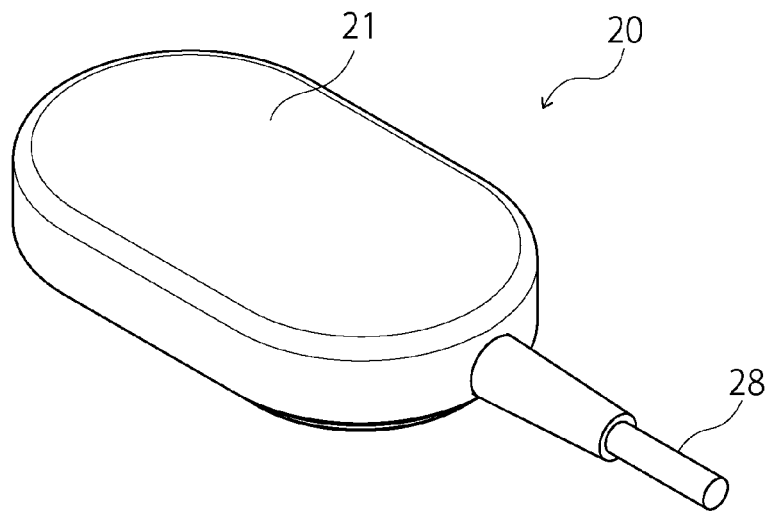
FIG. 7B is a perspective view of the counterpart connector viewed from its bottom side.
Figure 8A:
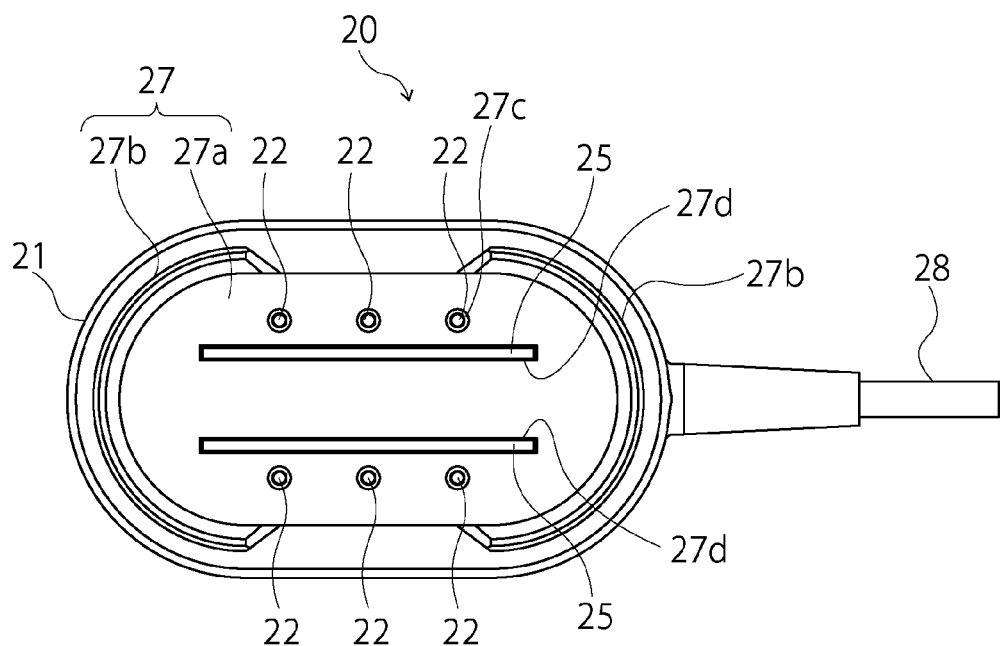
FIG. 8A is a plan view of the counterpart connector of FIGS. 7A and 7B.
Figure 8B:
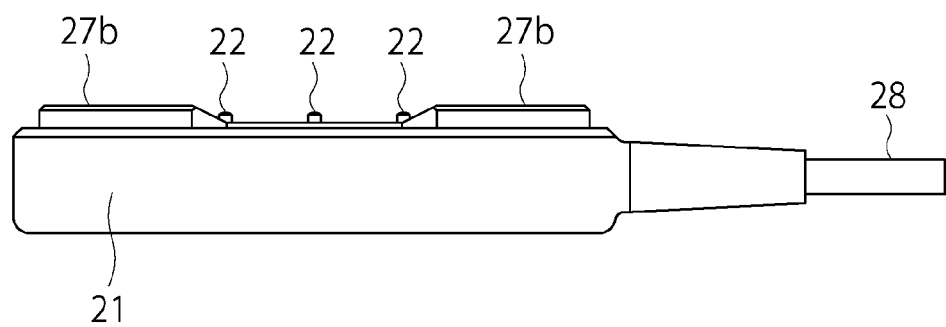
FIG. 8B is a side view of the counterpart connector of FIGS. 7A and 7B.

As shown in FIGS. 6A and 6B, the holding member 13 has a main body 13c and a ring-shaped projection portion 13b formed at its bottom end. A top surface 13a of the main body 13c is in a thin, long shape having rounded corners at both ends. A ring-shaped ridge portion 13d having an inclined side peripheral surface is formed in the middle of a side peripheral surface of the main body 13c. Therefore, when the holding member 13 is attached to the through hole 11e, the holding member 13 is prevented from dropping off.

Figure 1B:
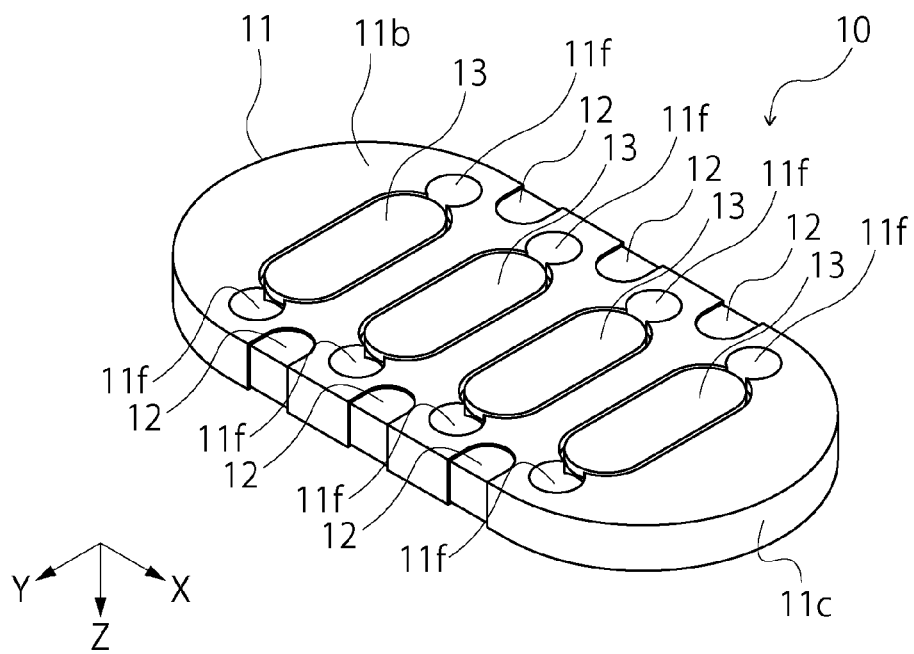
FIG. 1B is a perspective view of the connector viewed from its bottom side.
Figure 2A:
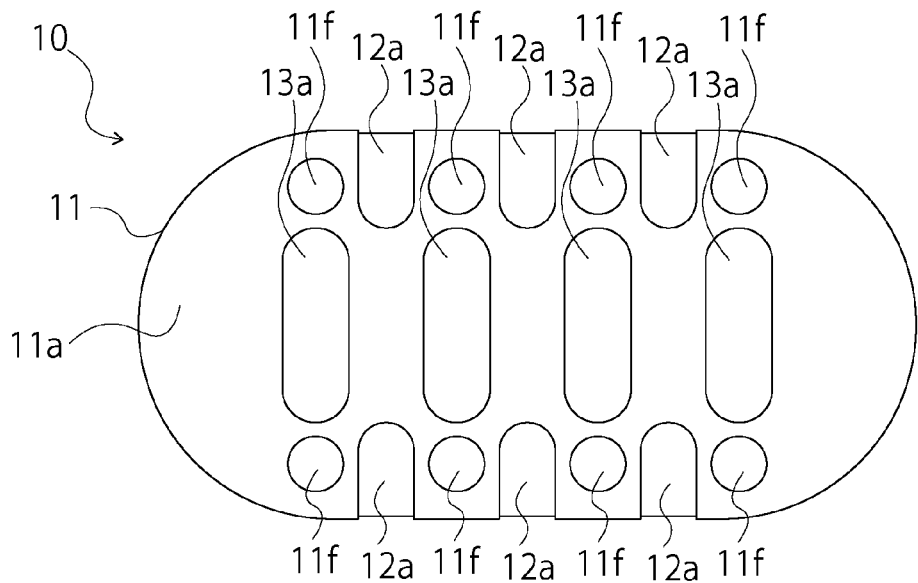
FIG. 2A is a plan view of the connector of FIGS. 1A and 1B.
Figure 2B:
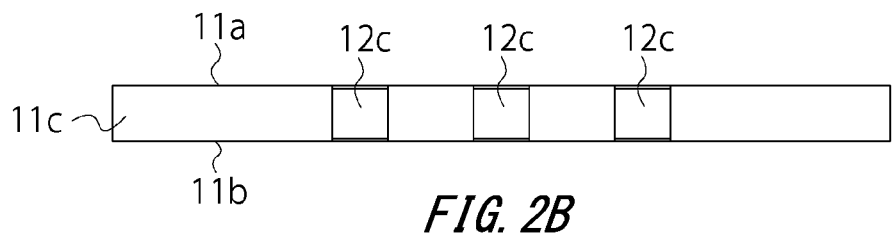
FIG. 2B is a side view of the connector of FIGS. 1A and 1B.
Figure 2C:
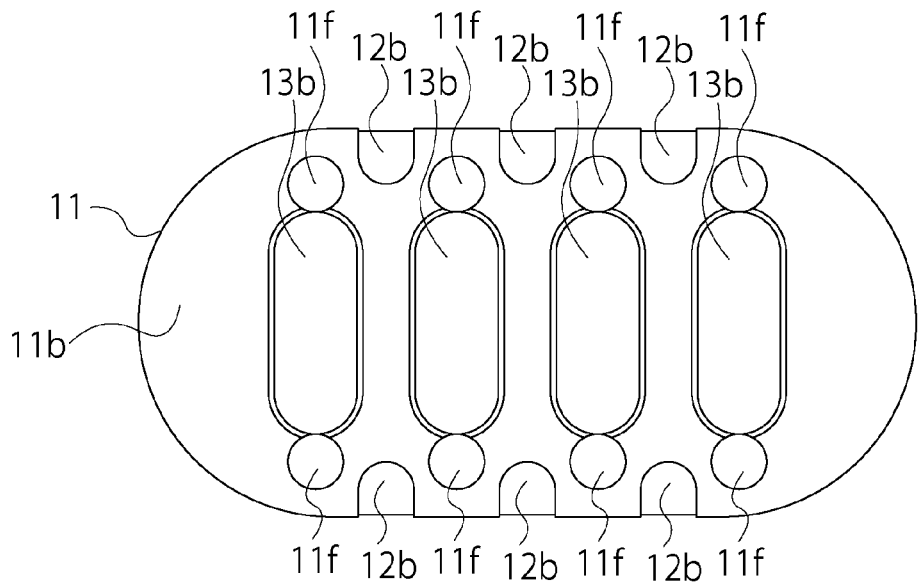
FIG. 2C is a bottom view of the connector of FIGS. 1A and 1B.

As shown in FIGS. 1A and 1B, the four holding members 13 are disposed in parallel apart from each other in the predetermined direction (X direction in FIGS. 1A and 1B) in the front surface 11a (one surface) of the housing 11. Therefore, as shown in FIG. 4B, the housing 11 of the connector 10 can be freely bent so as to bring at least both end portions of the housing 11 in the predetermined direction (X direction) close to each other.

In the present embodiment, the holding members 13 are formed of a magnetic metal, but the present invention is not limited thereto. The holding members 13 may be formed of a magnet. In the present embodiment, top surfaces 13a of the holding members 13 are exposed from the front surface 11a of the housing 11, but the present invention is not limited thereto. The holding members 13 may be embedded in the housing 11. The number of the holding members 13 is not limited to four, and may be set at an arbitrary number of 2 or more.

In the present embodiment, the holding members 13 are disposed in a single row, but may be arranged in two or more rows. For example, a plurality of holding members 13 may be disposed apart from each other in the X direction in FIGS. 1A and 1B and also apart from each other in the Y direction. In the present embodiment, the holding members 13 are disposed at regular intervals, but may be disposed at random intervals.

<Contact>

As shown in FIGS. 1A to 2C, the contacts 12 are formed in portions that extend from the front surface 11a of the housing 11 through a side surface 11c to the bottom surface 11b, as a coating layer formed of a conductive ink. The thickness of the coating layer is, for example, 30 to 50 μm.

More specifically, the contacts 12 include six contact portions 12a arranged on both side edges of the front surface 11a of the housing 11 in respective rows. In the bottom surface 11b of the housing 11, six contact portions 12b arranged on both the side edges are formed in respective rows. The contact portions 12a on the side of the front surface 11a of the housing 11 are connected to the contact portions 12b of the bottom surface 11b, on a one-by-one basis, through six connection portions 12c coated with the conductive ink to the side surface 11c of the housing 11.

<Counterpart Connector>

Next, the counterpart connector 20 to be fit to the connector 10 will be described.

As shown in FIGS. 7A to 8B, the counterpart connector 20 includes a counterpart housing 21, a shell 27, conductive counterpart contacts 22 provided in the counterpart housing 21, and a counterpart holding member 23 (refer to FIG. 9) constituted of the magnet 24 provided in the counterpart housing 21. When the connector 10 is fit to the counterpart connector 20, the contacts 12 are in contact with the counterpart contacts 22, and the holding members 13 of the connector 10 and the counterpart holding member 23 of the counterpart connector 20 are attracted to each other by a magnetic force, thereby maintaining a fit state.

Figure 9:
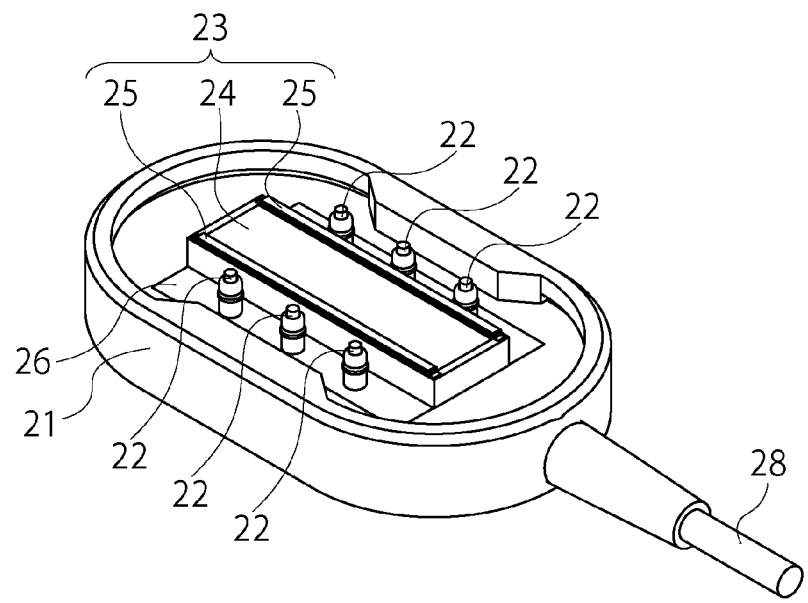
FIG. 9 is a perspective view in which a shell has been removed from the counterpart connector shown in FIGS. 7A and 7B.
Figure 10A:
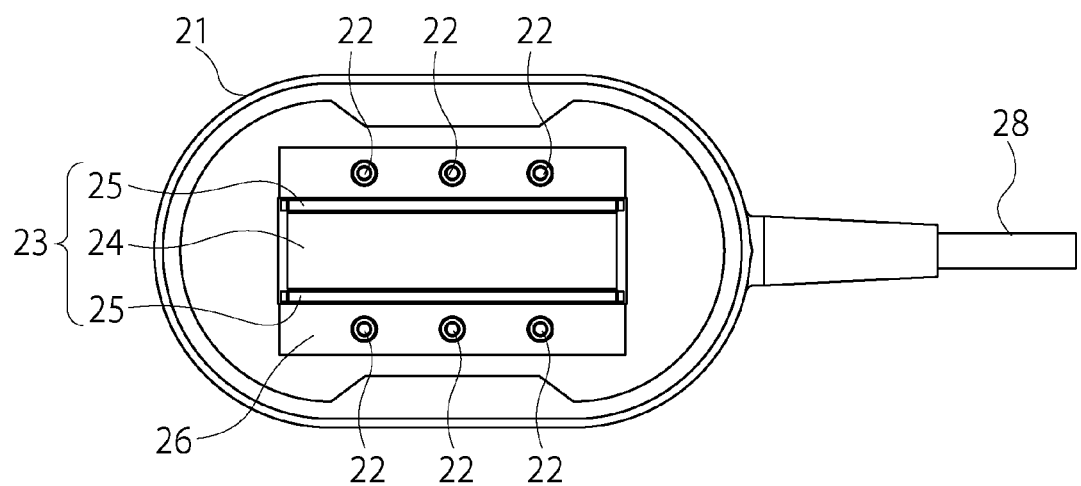
FIG. 10A is a plan view of the counterpart connector (without shell) shown in FIG. 9.
Figure 10B:
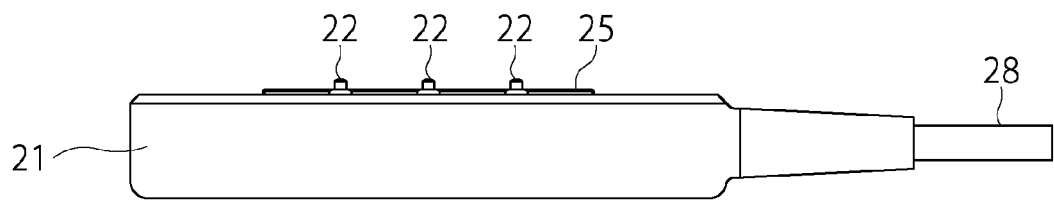
FIG. 10B is a side view of the counterpart connector (without shell) shown in FIG. 9.

FIGS. 9 to 10B show the counterpart connector 20 from which the shell 27 has been removed. The housing 21 is a container formed of an insulating material (for example, an insulating resin). The housing 21 is open on its top side.

The counterpart contact 22 is a spring pin in which a spring is mounted. The counterpart contact 22 is capable of being in elastic contact with the contact 12 of the connector 10. The counterpart contacts 22 are arranged in two rows, three per row on a board 26, so as to make contact with the contacts 12 of the connector 10, when the connectors are fit to each other. The counterpart contacts 22 are electrically connected to the electric wire 28 through wiring provided in the board 26.

Figure 11A:
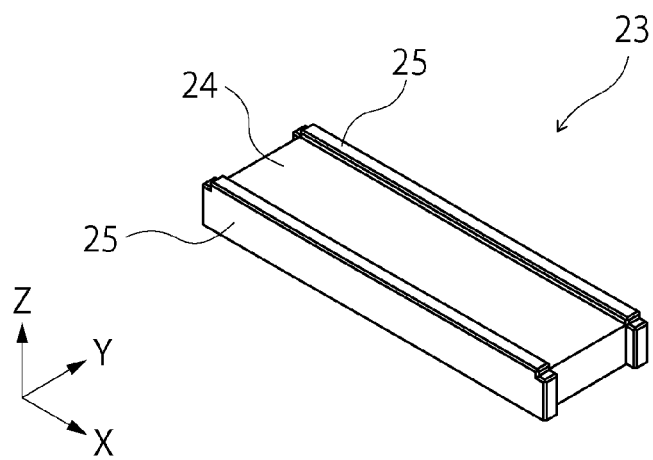
FIG. 11A is a perspective view of a holding member of the counterpart connector of FIGS. 10A and 10B.
Figure 11B:
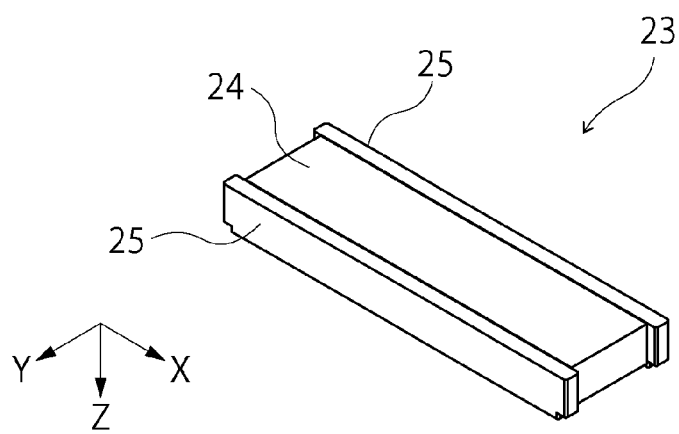
FIG. 11B is a perspective view of a holding member of the counterpart connector of FIGS. 10A and 10B viewed from its bottom side.

As shown in FIGS. 11A and 11B, the counterpart holding member 23 has the rectangular parallelepiped magnet 24 and board-shaped yokes 25 attached on both sides of the magnet 24. The yokes 25 are formed of, for example, magnetic stainless steel, and slightly protrude in the Z direction of the drawing from a top surface of the magnet 24. The yokes 25 increase a magnetic force of the magnet 24, as well as protecting the magnet 24. As shown in FIGS. 10A and 10B, the counterpart holding member 23 is accommodated in the counterpart housing 21 in a state of being mounted on a board 26.

As shown in FIGS. 7A to 8B, the shell 27 is formed of an insulating material, and has a bottom plate 27a and guide portions 27b provided on both ends thereof. The bottom plate 27a has approximately the same shape as that of the housing 11 of the connector 10 in a plan view. The guide portion 27b is bent in a half arc shape in a plan view. In the bottom plate 27a, through holes 27c are formed corresponding to the counterpart contacts 22, so that the counterpart contacts 22 protrude from the through holes 27c. Slots 27d are formed in the bottom plate 27a corresponding to the yokes 25, so that the yokes 25 protrude from the slots 27d.

When the connector 10 and the counterpart connector 20 are fit to each other, the housing 11 of the connector 10 is thereby guided by the shell 27 of the counterpart connector 20, to enable the connector 10 to be fit to an appropriate portion of the counterpart connector 20.

<Connector Assembly>

Next, a connector assembly 1 will be described.

Figure 12A:
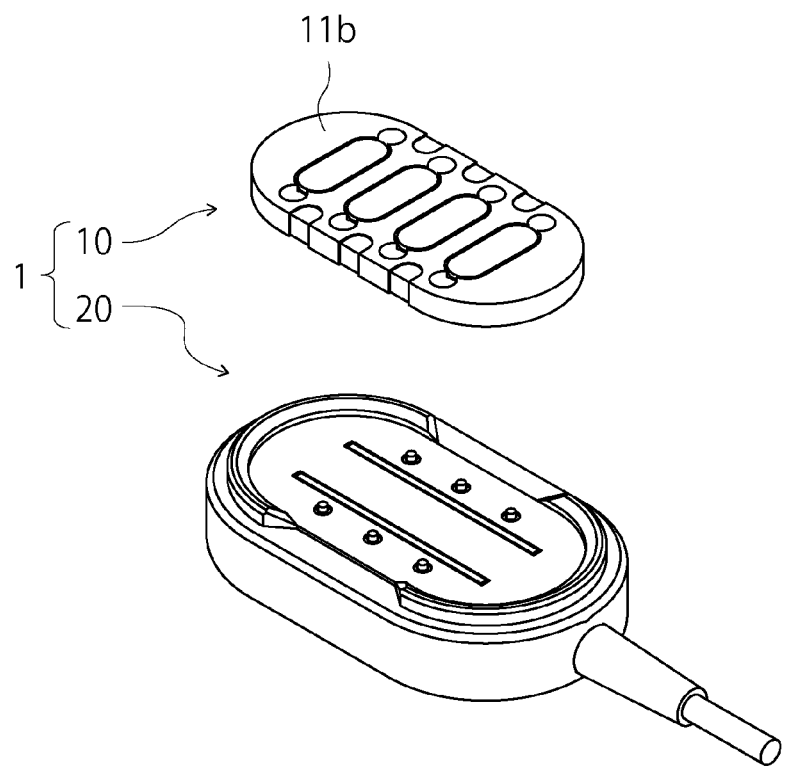
FIG. 12A is a perspective view of the connector of FIGS. 1A and 1B and the counterpart connector of FIGS. 7A and 7B before fitting.
Figure 12B:
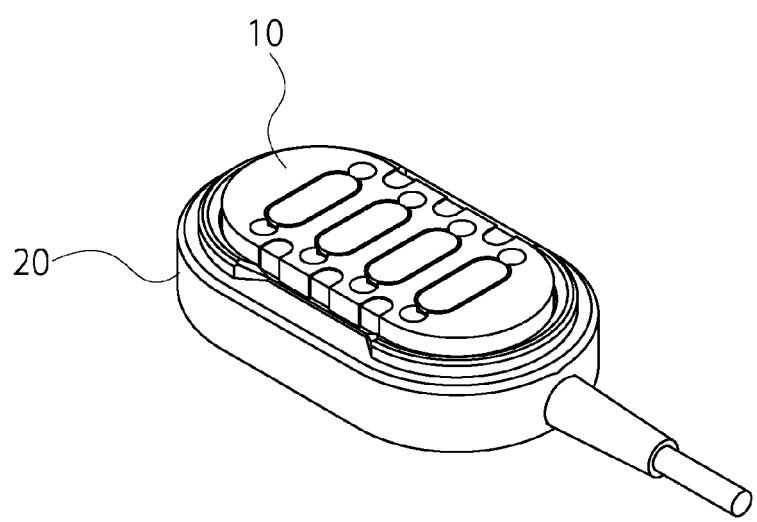
FIG. 12B is a perspective view of the connector of FIGS. 1A and 1B and the counterpart connector of FIGS. 7A and 7B after the fitting.

As shown in FIGS. 12A and 12B, the connector assembly 1 has the connector 10 and the counterpart connector 20. FIG. 12A is a perspective view of the connector 10 and the counterpart connector 20 before fitting, and FIG. 12B is a perspective view thereof after fitting.

As shown in FIG. 12A, a part of the connector 10 on the side of a bottom surface is fit into (accommodated in) the shell 27 of the counterpart connector 20 while being guided by the guide portions 27b. As shown in FIG. 12B, when the connector 10 and the counterpart connector 20 are engaged, the contact portions 12a of the contacts 12 of the connector 10 are in contact with corresponding top end contact portions of the counterpart contacts 22 of the counterpart connector 20. Each of the holding members 13 of the connector 10 is disposed across the two yokes 25 of the counterpart connector 20. In other words, the magnet 24 and the yokes 25 of the counterpart connector 20 and the holding members 13 of the connector 10 form one closed magnetic circuit. Each of the holding members 13 is thereby strongly attracted by the magnet 24 and the yokes 25.

Next, operation and effects will be described.

As described above, the housing 11 of the connector 10 according to the present embodiment is formed of the bendable plate-shaped insulating rubber. The plurality of holding members 13 formed of the magnetic metal are disposed in parallel apart from each other in the predetermined direction (X direction in FIG. 1) in the front surface 11a of the housing 11. Therefore, the housing 11 of the connector 10 can be freely bent so as to bring at least both the end portions of the housing 11 in the predetermined direction (X direction) close to each other. In other words, the holding members 13 do not interfere with the bending of the housing 11.

Since the connector 10 is provided with the fixing holes 11f of the housing 11, the connector 10 can be reliably and easily attached to the freely bendable object, such as the clothes 30, by sewing using the sewing threads 14. The connector 10 can be sewed on the clothes 30 without damage to the housing 11, so that it is possible to prevent damage to the housing 11 from sewed portions and maintain a stable sewed condition of the connector 10.

As shown in FIG. 3A, in each individual combination of the contact 12 and the corresponding conductive pattern 31, at least a part of the contact 12 is covered with the sewing threads 14 arranged in parallel rows along the predetermined direction in the front surface 11a (one surface) of the housing 11. The housing 11 is sewed with the sewing threads 14 in the vicinities of the contacts 12 and in the vicinity of the conductive pattern 31 of the clothes 30. Therefore, the housing 11 is bent while following the bending of the clothes 30, and the contacts 12 that have been individually sewed with the sewing threads 14 follow the conductive pattern 31. Therefore, the connection between the contacts 12 and the conductive pattern 31 is difficult to disconnect, thus enabling establishment of the stable electric connection.

The adjacently disposed two sewing threads 14 are inserted into the one fixing hole 11f between the contacts 12 next to each other, which are sewed with the sewing threads 14, and therefore the two sewing threads 14 share the one fixing hole 11f. Accordingly, the number of the fixing holes 11f into which the sewing threads 14 are to be inserted is not necessarily two per contact 12.

Figure 4A:
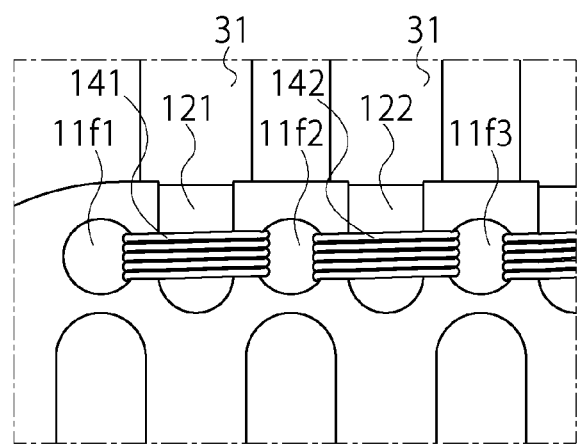
FIG. 4A is an enlarged view of a portion B of FIG. 3A.
Figure 4B:
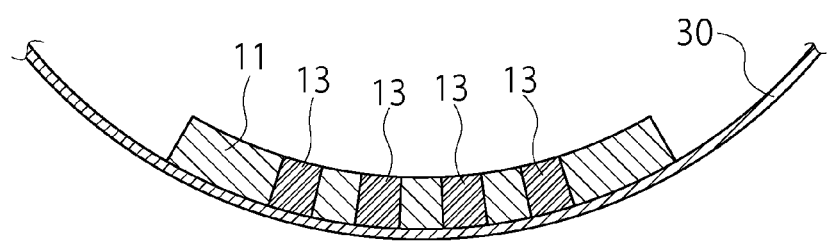
FIG. 4B is a cross-sectional view of the connector of FIGS. 1A and 1B sewed on the clothes in a bent state.

More specifically, as shown in FIG. 4A, a fixing hole 11f1 and a fixing hole 11f2 are formed, as the fixing holes 11f, so as to interpose a contact 121 therebetween. A sewing thread 141 is inserted into the two fixing holes 11f1 and 11f2. The fixing hole 11f2 and a fixing hole 11f3 are formed, as the fixing holes 11f, so as to sandwich a contact 122 next to the contact 121. A sewing thread 142 is inserted into the two fixing holes 11f2 and 11f3. In this manner, the sewing threads 141 and 142 are inserted while sharing the fixing hole 11f2, so that it is possible to prevent an increase in the number of the fixing holes 11f and therefore to downsize the connector 10.

Since the fixing holes 11f have a cylindrical shape, the connector 10 can be easily sewed on the clothes 30 using a button sewing function installed in general sewing machines.

Second Embodiment

Next, a second embodiment will be described.

The second embodiment is different from the first embodiment in terms of accommodation recessed portions 41g formed in a housing 41 to accommodate sewing threads 14. The other components are the same as those of the first embodiment, and so a description thereof is appropriately omitted.

Figure 13:
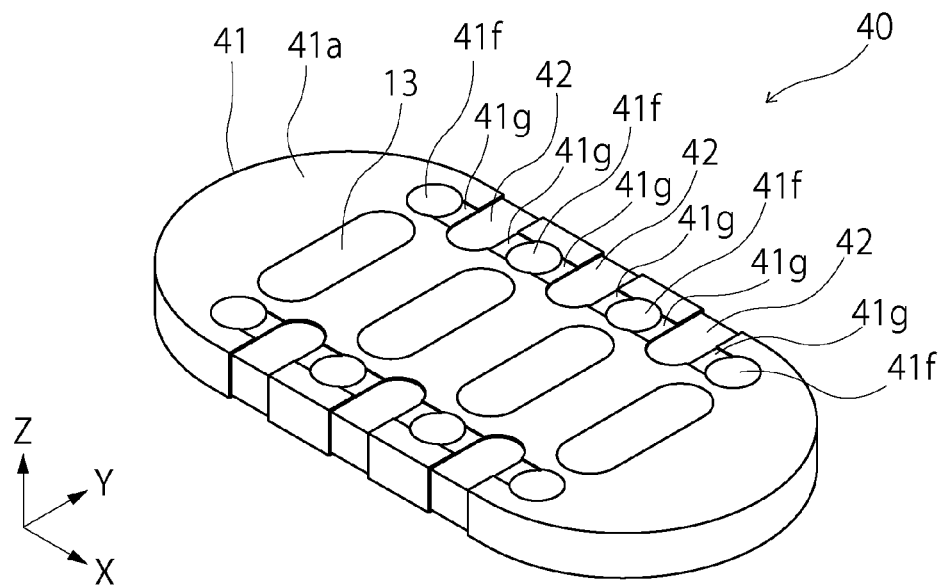
FIG. 13 is a perspective view of a connector according to a second embodiment of the present invention.
Figure 14A:
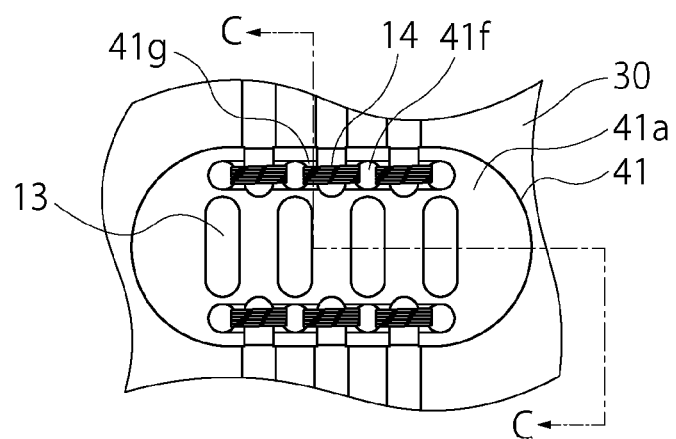
FIG. 14A is an explanatory view of the connector of FIG. 13 in a state of being sewed on clothes.
Figure 14B:
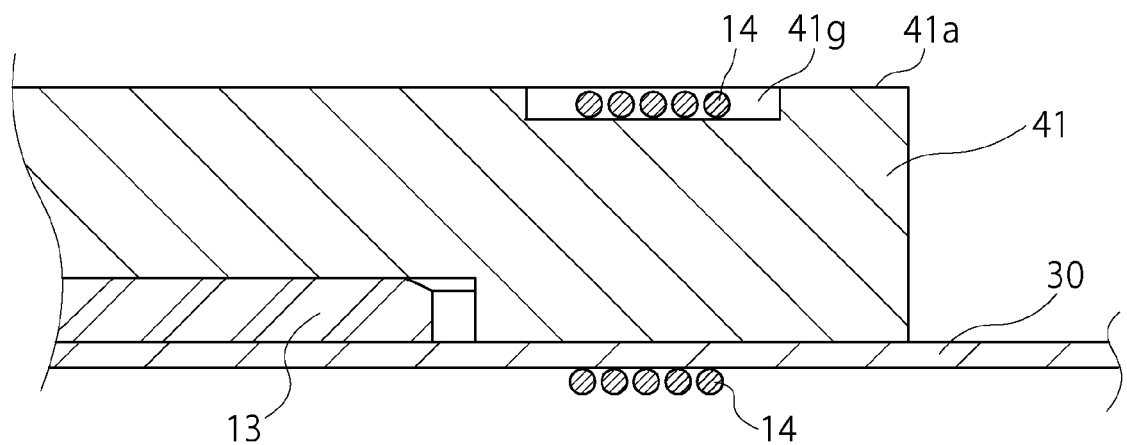
FIG. 14B is a cross-sectional view of the connector of FIG. 13 taken along line C-C of FIG. 14A.

As shown in FIGS. 13 to 14B, in a connector 40 according to the present embodiment, the accommodation recessed portions 41g that are lower than a front surface 41a (one surface) of the housing 41 are each provided at a portion between a fixing hole 41f and a contact 42 to dispose the sewing threads 14. The accommodation recessed portion 41g is deeper than the diameter of the sewing thread 14. In this manner, the accommodation recessed portion 41g is provided between each contact 42 and each fixing hole 41f adjacent thereto. On the side having no numerals in FIG. 13, the contacts, the fixing holes, and the accommodation recessed portions are configured in the same manner as illustrated in the drawing.

According to this configuration, the sewing threads 14 do not protrude from the front surface 41a of the housing 41 to the outside. In other words, when the connector 40 is fit to the counterpart connector 20, the sewing threads 14 do not interfere with the counterpart connector 20, and therefore the connector 40 can be fit to the counterpart connector 20 without a tilt. Therefore, the plurality of contacts 42 can be uniformly in contact with the counterpart contacts 22, thus enabling obtainment of stable electrical connection.

Third Embodiment

Next, a third embodiment will be described.

The third embodiment is different from the first embodiment in terms of contact projection portions 52d formed in contacts 52 to establish contact with a conductive pattern 31. The other components are the same as those of the first embodiment, and so a description thereof is appropriately omitted.

Figure 15:
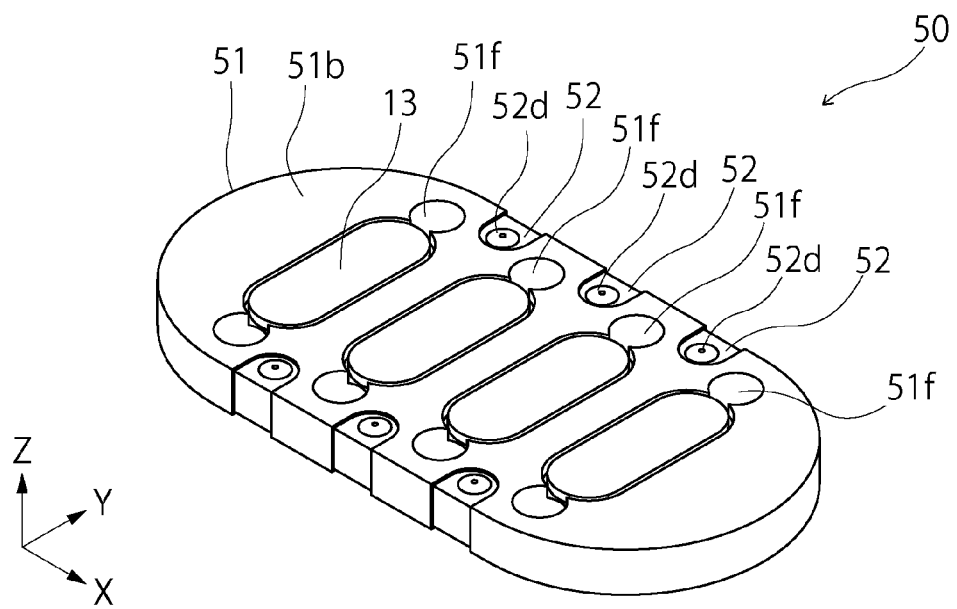
FIG. 15 is a perspective view of a connector according to a third embodiment of the present invention viewed from the side of a bottom surface thereof.
Figure 16A:
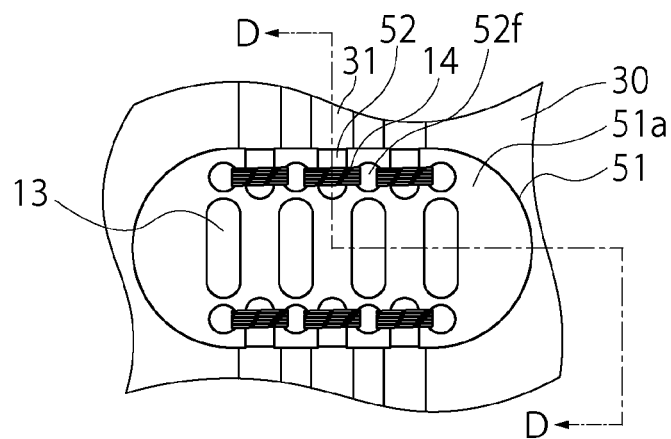
FIG. 16A is an explanatory view of the connector of FIG. 15 in a state of being sewed on clothes.
Figure 16B:
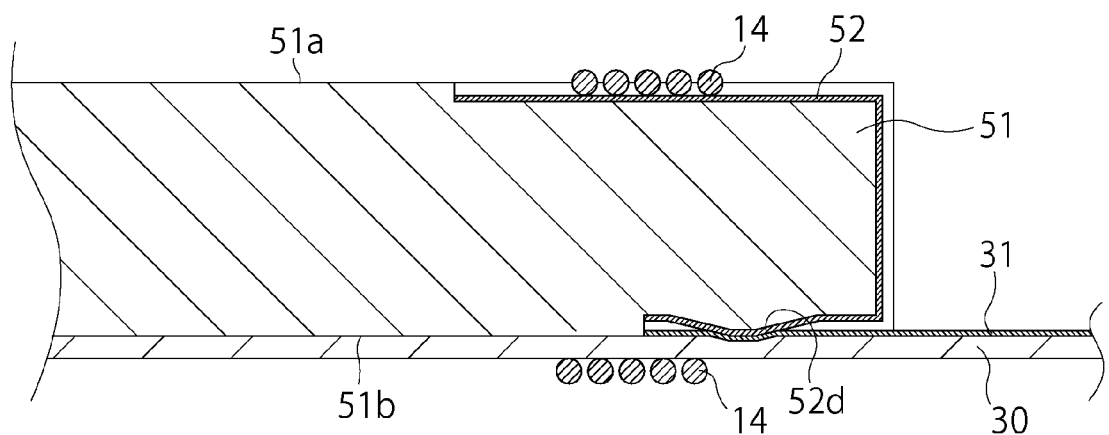
FIG. 16B is a cross-sectional view of the connector of FIG. 15 taken along line D-D of FIG. 15A.

As shown in FIGS. 15 to 16B, according to the present embodiment, the contact projection portions 52d that protrude from a bottom surface 51b of a housing 51 are formed in a connector 50. Since the contact projection portions 52d formed in the contacts 52 protrude outside from the bottom surface 51b of the housing 51, sewing the connector 50 on clothes 30 with sewing threads 14 allows the contact projection portions 52d to be in contact with the conductive pattern 31. On the side having no numerals in FIG. 15, the contacts and the contact projection portions are configured in the same manner as illustrated in the drawing.

According to this configuration, since the contacts 52 of the connector 50 can be electrically connected to the conductive pattern 31 of the clothes 30 by the connector 50 itself, it is possible to eliminate the need for providing a conductive member, such as a solder material or a conductive adhesive, thus allowing a reduction in the number of assembly processes on the clothes 30 and a cost reduction due to a reduction in the number of parts.

As the sewing thread, a conductive thread (for example, a stainless steel fiber, or a polyester thread on which a copper foil strip is wound) may be used, though it is not described above. In this case, in order to allow the sewing threads to be in contact with the contacts formed of the conductive ink coating layer, the contacts may protrude to the side of the sewing threads, or the conductive ink coating layer may be expanded to the inside of the fixing holes. Furthermore, by directly sewing the sewing threads on the conductive pattern of the clothes, the contacts and the conductive pattern can be electrically connected with the conductive sewing threads.

As described above, the embodiment(s) of the present invention has the effect of being usable, while being attached to the freely bendable object such as clothes, and the present invention is useful for the whole of connectors and connector assemblies.

REFERENCE SIGNS LIST

1 Connector
10, 40, 50 Connector
11, 41, 51 Housing
11a, 41a Front surface of housing
11b Bottom surface of housing
11c Side surface of housing
11d Recessed portion
11e Through hole
11f, 11f1, 11f2, 11f3, 41f, 51f Fixing hole
41g Accommodation recessed portion
12, 121, 122, 42, 52 Contact
12a Contact portion
12b Contact portion
12c Contact portion
52d Contact projection portion
13 Holding member
13a Top surface
13b Ring-shaped projection portion
13c Main body
13d Ring-shaped ridge portion
14, 141, 142 Sewing thread
20 Counterpart connector
21 Counterpart housing
22 Counterpart contact
23 Counterpart holding member
24 Magnet
25 York
26 Board
27 Shell
27a Bottom plate
27b Guide portion
27c Through hole
27d Slot
28 Electric wire
30 Clothes
31 Conductive pattern

The invention claimed is:
1. A connector to be fit to a counterpart connector, the connector comprising:
  a housing;
  a plurality of conductive contacts provided in the housing and formed through the housing from one surface of the housing to the other surface of the housing; and
  a plurality of holding members comprising a magnetic material provided in the housing, the holding members being configured to be attracted to a magnetic material of the counterpart connector when the connector is fit to the counterpart connector, to maintain a fit state, wherein
  the housing comprises a bendable insulating material, and has a plurality of fixing holes that penetrate through the housing from the one surface to the other surface and into which a fixing material is inserted, thereby fixing the housing to a freely bendable object,
  the holding members are disposed in parallel apart from each other in a predetermined direction in the one surface of the housing,
  the housing is bendable so as to allow both end portions of the housing to be brought close to each other in the predetermined direction, and the plurality of fixing holes are arranged in parallel rows along the predetermined direction in the one surface of the housing, such that the plurality of conductive contacts are interposed between the plurality of fixing holes in the predetermined direction.

2. The connector according to claim 1, wherein the fixing holes are formed in positions where each of the contacts is interposed therebetween.

3. The connector according to claim 1, wherein the housing is configured to have an accommodation recessed portion formed between the fixing hole and the contact in the one surface.

4. The connector according to claim 1, wherein the contact has a contact projection portion projecting to the side of the other surface.

5. The connector according to claim 1, wherein
the contact has a contact portion on the other surface of the housing,
the contact portion is configured such that the connector is electrically connected to a conductive pattern of the object, and
the fixing material is inserted into the fixing holes to fix the connector on the object.

6. The connector according to claim 5, wherein the fixing hole disposed between adjacent ones of the contacts is configured such that at least two of the fixing materials having been inserted into other fixing holes are inserted thereinto.

7. The connector according to claim 5, wherein the fixing material is a sewing thread.

8. A connector assembly comprising:
the connector according to claim 1; and
a counterpart connector to be fit to the connector, wherein
the counterpart connector includes a counterpart housing, a conductive counterpart contact provided in the counterpart housing, and a counterpart holding member having a magnetic material provided in the counterpart housing, and
when the connector is fit to the counterpart connector, the contact is in contact with the counterpart contact, and the holding member and the counterpart holding member are attracted to each other by a magnetic force to maintain a fit state.

* * * * *